United States Patent [19]

Hoeberechts

[11] Patent Number: 4,791,468

[45] Date of Patent: Dec. 13, 1988

[54] RADIATION-SENSITIVE SEMICONDUCTOR DEVICE

[75] Inventor: Arthur M. E. Hoeberechts, Eindhoven, Netherlands

[73] Assignee: U.S. Philips Corporation, New York, N.Y.

[21] Appl. No.: 153,523

[22] Filed: Feb. 2, 1988

Related U.S. Application Data

[63] Continuation of Ser. No. 890,793, Jul. 24, 1986, abandoned, which is a continuation of Ser. No. 692,853, Jan. 16, 1985, abandoned, which is a continuation of Ser. No. 572,591, Jan. 18, 1984, abandoned, which is a continuation of Ser. No. 272,458, Jun. 11, 1981, abandoned.

[30] Foreign Application Priority Data

Jul. 7, 1980 [NL] Netherlands .......................... 8003906

[51] Int. Cl.⁴ .................. H01L 27/14; H01L 31/00; H01L 31/14; H01L 29/06

[52] U.S. Cl. ............................. 357/30; 357/20; 357/31; 357/32

[58] Field of Search ................ 357/20, 24 LR, 30–32

[56] References Cited

U.S. PATENT DOCUMENTS

| | | | |
|---|---|---|---|
| 3,486,029 | 12/1969 | Barrett et al. | 357/19 |
| 3,548,233 | 12/1970 | Cave et al. | 357/31 |
| 3,601,668 | 8/1971 | Slaten et al. | 357/30 |
| 3,714,491 | 1/1973 | McIntyre et al. | 357/32 |
| 3,794,891 | 2/1974 | Takamiya | 357/30 |
| 3,858,233 | 12/1974 | Miyata et al. | 357/30 |
| 3,916,429 | 10/1975 | Kostelec | 357/30 |
| 3,949,223 | 4/1976 | Schmidt et al. | 357/32 |
| 4,067,104 | 1/1978 | Traeg | 357/65 |
| 4,167,748 | 9/1979 | D'Angelo et al. | 357/30 X |
| 4,231,820 | 11/1980 | Henry | 357/32 |
| 4,292,645 | 9/1981 | Schlosser et al. | 357/29 |
| 4,329,702 | 5/1982 | Wallace | 357/29 X |
| 4,355,320 | 10/1982 | Tihanyi | 357/300 R |
| 4,369,458 | 1/1983 | Thomas et al. | 357/300 R |
| 4,376,285 | 3/1983 | Leonberger et al. | 357/30 |

OTHER PUBLICATIONS

J. I. Nishizawa et al, "Static Induction Transistor Image Sensors", *IEEE Transactions on Electron Devices*, vol. ED-26 (1979), pp. 1970–1977.

T. Sugeta et al, "High–Gain Metal-Semiconductor-Metal Photodetectors for High-Speed Optoelectronic Circuits", *IEEE Transactions on Electron Devices*, vol. ED-26 (1979), pp. 1855–1856.

H. Holloway et al., "IV–VI Semiconductor Lateral–Collection Photodiodes", *Applied Physics Letters*, vol. 32 (1978), pp. 65–67.

*Primary Examiner*—J. Carroll
*Attorney, Agent, or Firm*—Steven R. Biren

[57] ABSTRACT

In a radiation-sensitive semiconductor device, for example a quadrant diode, having several rectifying junctions, the mutual distance between these junctions can be considerably reduced by keeping the junctions cut off by means of circuit elements in such manner that associated depletion regions touch each other. Charge carriers generated between two junctions are substantially always collected by the appropriate junction. With this arrangement, low crosstalk and good high-frequency properties can be realized. Furthermore, the semiconductor body in which the rectifying junctions are realized may comprise further circuit elements, which permits integration of the radiation-sensitive semiconductor device with other elements.

12 Claims, 6 Drawing Sheets

RADIATION-SENSITIVE SEMICONDUCTOR DEVICE

This is a continuation of application Ser. No. 890,793, filed July 24, 1986, which is a continuation of application Ser. No. 692,853, filed Jan. 16, 1985, which is a continuation of application Ser. No. 572,591, filed Jan. 18, 1984, which is a continuation of application Ser. No. 272,458, filed June 11, 1981, now all abandoned.

BACKGROUND OF THE INVENTION

The invention relates to a radiation-sensitive semiconductor device comprising a semiconductor body which at a substantially flat surface comprises at least one radiation-sensitive diode having at least two sub-elements of which at least one has a connection to provide a signal proportional to the radiationgenerated current through the sub-element.

A radiation-sensitive diode may be understood to be a photodiode or, for example, a radiation-sensitive base-collector junction of a photo-transistor or other radiation-sensitive semiconductor junctions or metal-to-semiconductor junctions. In the case of a photo-transistor the connection to record the generated current is usually connected to an emitter of the photo-transistor.

Radiation-sensitive semiconductor devices of the above-mentioned kind are used, for example, in photosensitive circuits for displaying pictures and in devices for track-following or positioning light beams (or beams of different wavelengths of radiation). Applications other than radiation detection are in the field of spectroscopic analysis, notably in the wavelength range from 200–1100 nanometers and, for example, soft X-ray radiation. In addition such devices are used for the detection of particle radiation (for example, electrons and α-particles).

In existing radiation-sensitive devices, for example quadrant diodes, the sub-elements are formed by semiconductor zones which are situated at the surface of the semiconductor body and which have a connection to record the photoelectric current through the sub-element and which form rectifying junctions with the surrounding part of the semiconductor body. When the radiation-sensitive diode is reverse biased, depletion regions are present at the area of the sub-elements in the semiconductor body (and in the semiconductor zones). In said depletion regions an electric field which is determined substantially entirely by the voltage across the diode prevails. When charge carriers are generated in the depletion regions as a result of incident radiation, said carriers contribute to a photo-electric current through the sub-elements under the influence of the prevailing electric field.

In such radiation-sensitive semiconductor devices there is the problem of crosstalk between the sub-elements. In existing devices this problem has been solved by providing a sufficiently large spatial separation between the sub-elements and the associated depletion regions. Charge carriers which are generated in or near the depletion region of a sub-element then substantially do not contribute to the photoelectric current through other subelements.

However, such a spatial separation is at the sacrifice of the resolving power of the device: notably, narrow beams or small displacements of a beam between two sub-elements are not clearly detected as a variation in the photoelectric current through adjacent sub-elements.

Charge carriers are also generated between the depletion regions. These can either disappear by recombination or reach a depletion region of a sub-element by diffusion and provide a contribution there to the photoelectric current. This contribution is slower and can moreover reach sub-elements other than the adjacent ones.

In U.S. Pat. No. 3,858,233, measures are suggested to cause radiation which is incident approximately centrally between two sub-elements to provide a substantially negligible contribution to the photoelectric current. For this purpose, a layer of radiation-absorbing material is provided between adjacent elements over at least a part of the surface present between the sub-elements. In this manner, a separation strip is formed between two sub-elements where incident radiation does not reach the semiconductor surface.

As a result of the presence of a radiation-absorbing layer, radiation which is incident at the area of said layer does not contribute or hardly contributes to a photoelectric current. This reduces the sensitivity of such a device.

SUMMARY OF THE INVENTION

It is an object of the invention to provide a radiation-sensitive semiconductor device of the kind mentioned above having a large resolving power and a large radiation sensitivity, in which the crosstalk between sub-elements is very small. Another object of the invention is to provide a high-speed radiation-sensitive semiconductor device.

The invention is based on the recognition of the fact that diffusion-determined contributions to the photoelectric current can be substantially avoided by providing an appropriate electric field.

For this purpose, a first embodiment of a radiation-sensitive semiconductor device according to the invention is characterized in that the distances between adjacent sub-elements of a quadrant radiation-sensitive diode are so small that, by applying a reverse voltage across the radiation-sensitive diode, regions present between adjacent sub-elements of the diode can be depleted fully by depletion regions associated with the sub-elements.

A second embodiment of a radiation-sensitive semiconductor device according to the invention is characterized in that the device comprises at least one circuit element with which such a reverse voltage can be applied across the radiation-sensitive diode such that regions present between adjacent sub-elements are fully depleted by depletion regions associated with the sub-elements.

Since the region between two sub-elements is fully depleted, directed electric fields prevail in the whole region between these sub-elements. Charge carriers which are generated here as a result of incident radiation move to the associated sub-elements under the influence of said fields and contribute there to the photoelectric current.

Since the depletion regions of adjacent sub-elements contact each other (or partly overlap each other) the mutual distance between two sub-elements can be very small (in the order of a few micrometers). This gives a radiation-sensitive semiconductor device according to the invention a very large resolving power.

A result of the fully depleted state of the intermediate region is that substantially no charge carriers occur which contribute to the photo-electric current by diffusion. Therefore the photo-electric current comprises substantially no contribution determined by diffusion, which enables a rapid response time of the diode.

Another result of the fully depleted state of the intermediate region and the consequent lack of a diffusion-determined contribution to the photo-electric current is that said intermediate region need not be protected against incident radiation. A radiation-absorbing layer above a part of the intermediate region is therefore not necessary. This gives a great sensitivity since now substantially all radiation can penetrate into the semiconductor body and generate charge carriers there which contribute to the photoelectric current.

In a preferred embodiment the radiation-sensitive diode comprises a number of sub-elements situated symmetrically about a point of the surface. Such a construction is inter alia very suitable for the determination of beam positions.

In another preferred embodiment several radiation-sensitive diodes comprise a common sub-element.

Such a device in which a number of diodes form the base-collector junction of photo-transistors can be used, for example, in a combined track following-positioning circuit, for example, for disk display apparatus based on optical reading (for example VLP).

A further preferred embodiment of a radiation-sensitive semiconductor device in accordance with the invention is characterized in that the device comprises at least one current detector for current generated by incident radiation. Such a current detector may be used for generating a control signal, for example, in the said track following positioning circuit or for detecting a photo-electric current, for example, in a spectrometer which comprises a radiation-sensitive semiconductor device according to the invention.

BRIEF DESCRIPTION OF THE DRAWING

The invention will now be described in greater detail with reference to a number of examples and the drawing, in which.

The Figures are diagrammatic and not drawn to scale. For clarity in the cross-sectional views the dimensions, in particular in the direction of thickness, are strongly exaggerated. Semiconductor zones of the same conductivity type are generally shaded in the same direction; in the various embodiments corresponding parts are generally referred to by the same reference numerals.

DESCRIPTION OF THE PREFERRED EMBODIMENTS

Figure 1:
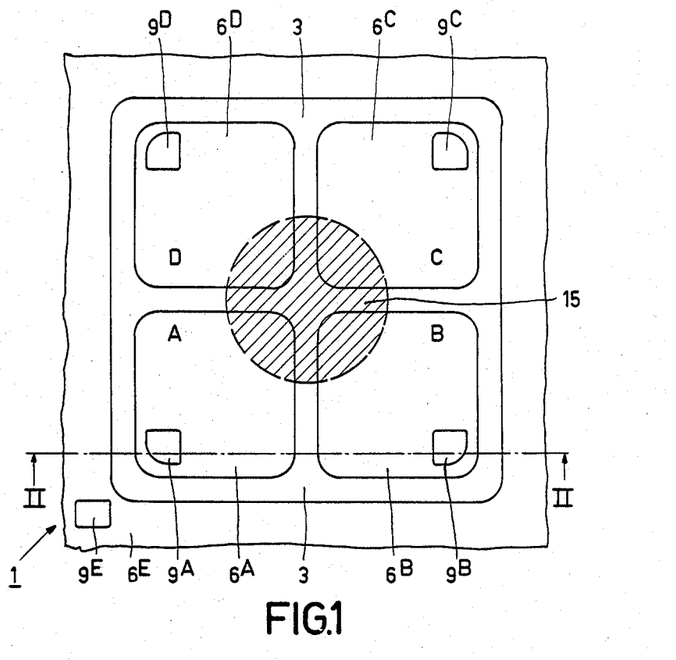
FIG. 1 is a plan view of a part of a radiation-sensitive semiconductor device according to the invention.
Figure 2:
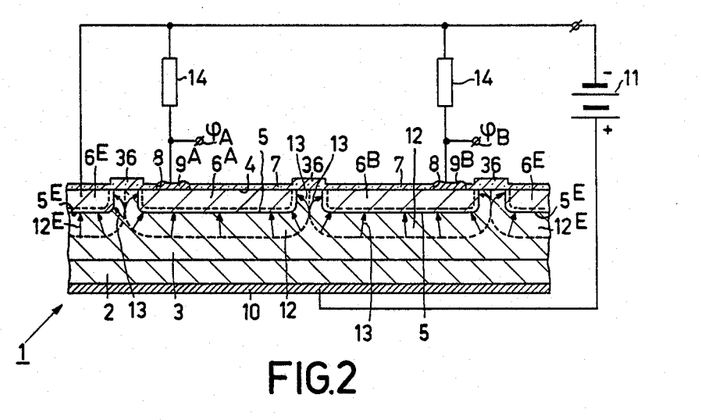
FIG. 2 is a cross-sectional view of the semiconductor device taken on the line II—II in FIG. 1.

The radiation-sensitive semiconductor device shown in FIGS. 1 and 2 comprises a semiconductor body 1 of silicon. This semiconductor body 1 comprises a low-ohmic substrate 2 on which an n-type epitaxial layer 3 is provided in a thickness of approximately 10 micrometers and a resistivity in the order of 100–200 ohm.cm. At a substantially flat surface 4 the semiconductor body 1 has mutually separated rectifying junctions 5. For this purpose the semiconductor body 1 at its surface 4 has surface regions 6 of the p-type which with the epitaxial layer 3 form the said rectifying junctions 5 (p-n junctions); four sub-elements 6A, 6B, 6C, 6D are situated symmetrically about a common center. These sub-elements form part of a so-called quadrant diode.

The surface 4 of the semiconductor body 1 is further coated with a passivating antireflection layer 7 of silicon-oxide. Contact windows 8 for contacts 9 (9A, 9B, 9C, 9D) are present in the layer 7. On the lower side of the semiconductor body the substrate 2 is contacted by means of a contact metallization 10.

The p-n junctions 5 can be reverse biased by means of a voltage at the contacts 9, 10. As a result of this, near each p-n junction 5 in the epitaxial layer 3 and the associated surface region 6 a depletion region is created, denoted in FIG. 2 by means of broken lines. In so far as these depletion regions extend in the epitaxial layer 3, they are referenced 12. The electric field lines as a result of electric fields prevailing in such regions 12 are denoted by means of arrows 13.

When light or radiation of sufficiently high energy is incident on the surface 4 of the semiconductor body 1 (at least equal to the width of the forbidden band of the semiconductor material) extra charge carriers (holes and electrons) are generated in the semiconductor body. In the depletion regions these extra charge carriers are removed as a result of the prevailing field and so contribute to a photoelectric current through the associated p-n junction.

According to a first aspect of the invention the distances between the sub-elements are so small that by applying a reverse voltage across the radiation-sensitive diode, regions present between adjacent sub-elements can be depleted by depletion regions associated with the sub-elements.

With a mutual distance between the p regions 6 of approximately 4 micrometers a reverse voltage of approximately 8 volts across the adjoining p-n junctions 5 is sufficient for the associated depletion regions 12 in the epitaxial layer 3 to contact each other. At the area of the contact face of depletion regions 12 associated with juxtaposed p-n junctions 5, the electric field lines deflect in such manner that as a result of the prevailing electric field the charge carriers generated in the depletion region move substantially always to the associated p-n junction. In this manner they contribute to the photoelectric current generated in said p-n junction.

The mutual distance between the p-type regions 6 is many times smaller than in known radiation-sensitive devices so that a much better resolving power is obtained with the FIG. 1 device. In addition, the epitaxial layer 3 is depleted over the greater part of its thickness so that, notably in the wavelength range from 400 to 1100 nanometers, substantially no contribution to the photo-electric current is applied by diffusion of generated charge carriers; this makes the device considerably more rapid. In addition, the semiconductor surface is sensitive to incident radiation over the whole region between the surface regions 6. This means that very narrow beams can be detected.

According to a second aspect of the invention, the device comprises at least one circuit element with which such a reverse voltage can be applied across the radiation-sensitive diode such that regions present between adjacent sub-elements are fully depleted by depletion regions associated with the sub-elements.

For this purpose, in FIG. 2 the sub-elements $6^A$, $6^B$, $6^C$, $6^D$ are connected to a voltage source 11 via resistors 14. For contacting purposes the sub-elements $6^A$, $6^B$, $6^C$, $6^D$ comprise contact metallizations $9^A$, $9^B$, $9^C$, $9^D$ via contact holes 8 in the passivating layer 7 which covers the semiconductor body. Such a voltage is applied across the p-n junctions 5 by the voltage source 11 that the epitaxial layer 3 is again depleted over the greater part of its thickness. This again provides the above-mentioned advantages as regards velocity and sensitivity.

The devices shown have a frequency characteristic with a flat variation to above 100 MHz, that is to say that a sub-element which is exposed to a pulse train of light signals showed no noticeable variation in response up to a signal frequency of more than 100 MHz.

A photoelectric current generated in a p-n junction 5 causes a voltage drop across the associated resistor 14 and thus provides an output signal $\phi$. When, for example, a light beam in the center of the quadrant diode (shown in FIG. 1 by means of the shaded part 15) is incident normal to the surface 4, the photoelectric current generated in the four sub-elements $6^A$, $6^B$, $6^C$, $6^D$ are substantially equal. When the position of the incident beam is slightly shifted relative to the center 15, differences will occur in the output signals $\phi_A$, $\phi_B$, $\phi_C$ and $\phi_D$. These output signals may then be applied to a control system which controls the place of the incident beam. In the article "Optical Video Disks with undulated tracks" by J. J. M. Braat and G. Bouwhuis in the periodical *Applied Optics*, vol. 17, No. 13, pp. 2022–2028 (July 1, 1978) it is described how such a quadrant diode can be used in a video disk display device.

The quadrant diode shown in FIGS. 1, 2 comprises in addition to the sub-elements $6^A$, $6^B$, $6^C$, $6^D$ a sub-element which fully surrounds said regions. The p-n junction $5^E$ associated with said sub-element is reverse biased by means of the voltage source 11 in such manner that the associated depletion region $12^E$ at least touches the depletion regions 12 associated with the p-n junctions 5 between the epitaxial layer 3 and the p-type surface regions $6^A$, $6^B$, $6^C$, $6^D$. The result of this measure is that charge carriers generated by light which is not incident on the sub-elements $6^A$, $6^B$, $6^C$, $6^D$ and parasitically generated charge carriers (for example originating from the edge of the crystal), contribute substantially only to a current through the p-n junction $5^E$ so that they do not provide parasitic contributions to the photoelectric current through one of the p-n junctions 5 of the sub-elements $6^A$, $6^B$, $6^C$, $6^D$, as a result of diffusion.

The semiconductor device shown in FIGS. 1, 2 can be manufactured by means of techniques generally known in semiconductor technology. Starting material is an n-type silicon substrate 2 on which the n-type epitaxial layer is grown. The surface regions 6 are obtained, for example, by means of implantation of p-type impurities followed by a diffusion step or annealing step. The surface regions 6 can also be provided directly by diffusion.

Figure 3:
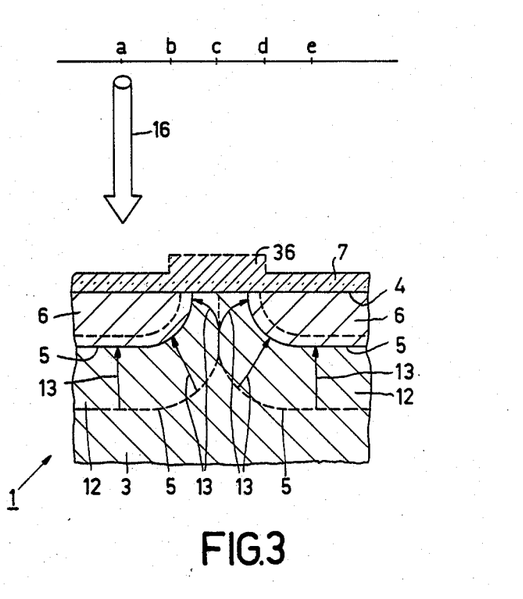
FIG. 3 shows a measuring method to determine the resolving power of such a semiconductor device.
Figure 4:
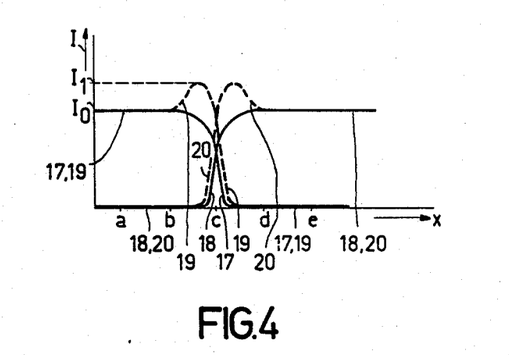
FIG. 4 shows some results obtained by the method shown in FIG. 3.

FIG. 3 shows diagrammatically a measurement to determine the resolving power between two radiation-sensitive junctions in a common semiconductor body, as described above. FIG. 4 shows some measured results, both for a semiconductor device in which between two surface regions 6 measures are taken to cause less radiation to penetrate into the semiconductor body than elsewhere, and for a semiconductor device in which this is not the case, for example, in that after the manufacture the surface 4 has been cleaned and been provided with a passivating anti-reflection layer 7.

A beam 16, for example a laser beam, moves over the surface 4 of the semiconductor body 1 which forms part of a semiconductor device according to the invention. When the beam 16 is present at the area of the point a, the photo-electric current generated in the underlying p-n junction 5 is formed substantially only in a flat part of said junction parallel to the surface 4. This gives rise to a current having a value $I_o$ (curves 17, 19 in FIG. 4) through said junction. The current through the adjacent p-n junction 5 is negligibly small (curve 18, 20 in FIG. 4). Not all charge carriers generated by the beam 16 contribute in the point a to the photoelectric current since some are lost by recombination in the surface region 6 (and also slightly in the part of the epitaxial layer 3 possibly not depleted). The incident radiation is also reflected, albeit to a small extent, by the passivating layer 17 and is slightly absorbed in the surface region 6 before said radiation reaches the depletion region of the p-n junction 5. When the beam 16 is at the area of the point b, the influence of the curvature of the p-n junction 5 becomes noticeable. The distance between the surface 4 and the depletion region is shorter so that fewer charge carriers are lost by recombination and also less radiation is absorbed in the surface region 6. With the thickness of the layer 7 remaining the same, this provides an extra contribution to the photoelectric current (curve 19 in FIG. 4). Accordingly, as the beam 16 moves farther over the surface 4, said extra contribution first rapidly increases to a value $I_1$ after which beyond point c, substantially between the two surface regions 6, the photoelectric current 19 rapidly decreases in that the electric fields (denoted by arrows 13) in the depletion region 15 cause substantially all generated charge carriers to contribute to the photoelectric current through the adjacent p-n junction. The current associated with said adjacent p-n junction first rapidly icnreases to the value $I_1$, when the beam 16 moves further, to decrease again to the value $I_o$ (see curve 20 in FIG. 4).

The layer 7 between the surface regions 6 may show a thickening 36, for example, in that the original diffusion mask or implantation mask has remained on the surface 4. This thickening may be chosen to be so that at the area of said thickening 36 a larger part of the incident light is reflected. The generated photoelectric currents then flow approximately according to the curves 17, 18 in FIG. 4 instead of according to curves 19, 20. Such smoothed curves 17, 18 are much more suitable for applications in control apparatus than the curves 19, 20.

The mutual optical separation between the surface regions 6 has proven to be very good upon measurement according to the method of FIG. 3. The crosstalk in a device according to the invention between two adjacent p-n junctions 5 with a distance between the surface regions 6 of approximately 4 micrometers was smaller than 60 decibels, in other words, upon exposure of one junction the value of the measured photocurrent through the adjacent unexposed junction was less than one-thousandth of that in the exposed junction.

Figure 5:
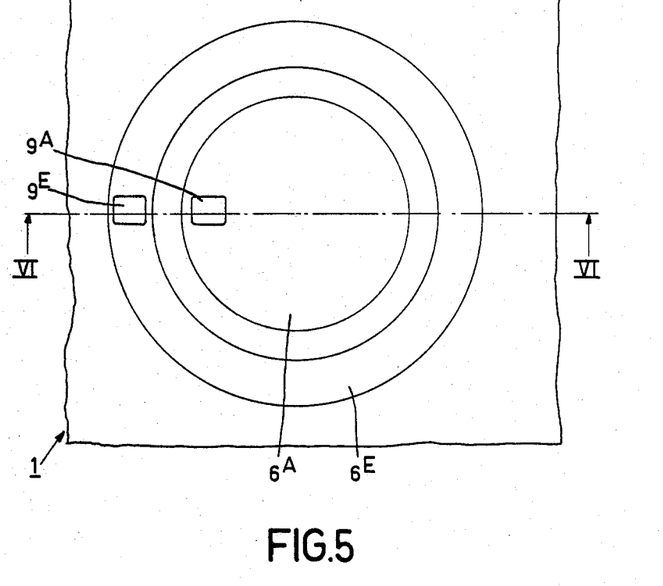
FIG. 5 is a plan view of another radiation-sensitive semiconductor device in accordance with the invention.
Figure 6:
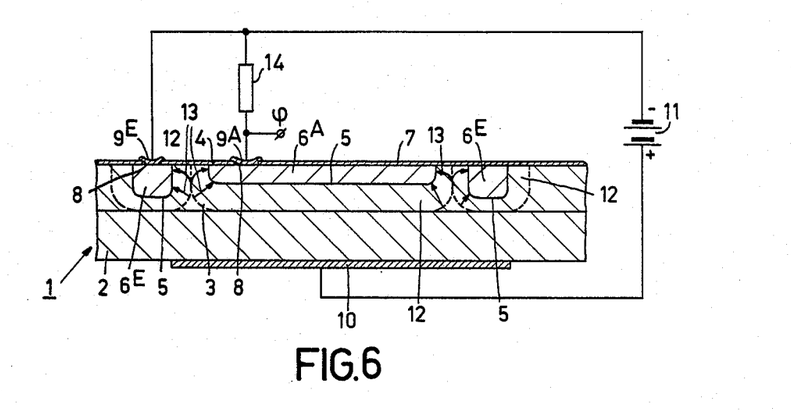
FIG. 6 is a cross-sectional view of the semiconductor device of FIG. 5 taken on the line VI—VI.

FIGS. 5 and 6 show a photodiode in which one sub-element $6^A$ is provided with a connection to detect the generated photocurrent. The semiconductor body 1 comprises a low-ohmic substrate 2 and an epitaxial layer 3 grown thereon, both of the n-type. The epitaxial layer has a thickness of approximately 5 micrometers and a resistivity of 50–200 ohm.cm. The epitaxial layer 3 has a circular surface region $6^A$ at its surface 4 and a second annular surface region $6^E$ which surrounds the region $6^A$ entirely. The two surface regions 6 are of the p-type. The mutual distances between the regions $6^E$ and $6^A$ is approximately 4 micrometers. At a reverse voltage of approximately 10V across the p-n junction 5 associated with the region $6^A$, the epitaxial layer 3 is depleted substantially entirely. Since between the regions $6^A$ and $6^E$ the depletion regions 12 contact each other, charge carriers generated there are rapidly dissipated to the regions $6^A$ and $6^E$, respectively, due to the presence of directed electric fields (indicated by arrows 13). A very rapid photodiode is thus obtained in which substantially no stray effect occurs. In addition, the contribution to the diode capacitance originating from the edge of the region $6^A$ is substantially nil. The remaining reference numerals have the same meanings as in FIGS. 1 and 2.

In the semiconductor body 1 shown in FIGS. 1 and 2, other semiconductor elements, for example, transistors, resistors, etc. can also be realized in addition to the photosensitive diodes. For example, photo-transistors may also be provided in the semiconductor body. A semiconductor body 1 which forms part of a radiation-sensitive semiconductor device and which in addition to diodes also comprises photo-transistors F, G, is shown in a plan view in FIG. 7, while FIG. 8 is a cross-sectional view taken on the line VIII—VIII of FIG. 7. The device shown in FIGS. 7 and 8 again comprises separated p-n junctions between the n-type epitaxial layer 3 and p-type surface regions 6. The p-type surface regions $6^A$, $6^B$, $6^C$, $6^D$ together with the surrounding region $6^E$ again form a quadrant diode as described above, while the p-type surface regions $6^F$, $6^G$ form the bases of photo-transistors with n-type emitter regions $21^F$, $21^G$. The surface region $6^E$ forms a common sub-element of both the quadrant diode and the two photo-transistors F, G. Such a semiconductor device may be used in video disk display devices for both positioning and track following.

Figure 9:
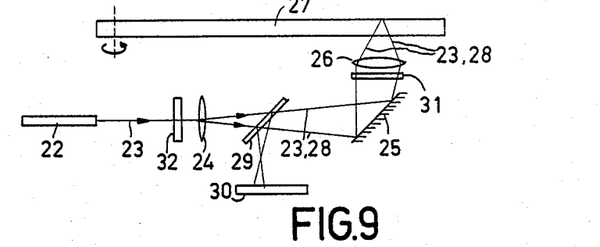
FIG. 9 shows a part of a videodisk display device in which the device shown in FIGS. 7 and 8 is used.

FIG. 9 shows such a display device by way of example. A monochromatic beam 23 generated by a laser 22 is displayed on a video disk 27 by means of a lens 24, a mirror 25 and an objective 26. The beam 28 modulated by the videodisk 27 is reflected via the objective 26 and the mirror 25 and is displayed on a detector 30 by means of a polarizing mirror 29. A ¼λ plate 31 together with the polarizing mirror 29 separates the forward beam from the return beam, which is displayed on the detector 30. For track following purposes two extra beams are generated by means of a grid 32 and impinge on the track on the video disk immediately before and immediately after the beam 23. After reflection said beams are also displayed on the detector 30.

The difference in light intensity on photodiodes (or photo-transistors) provided in the detector is indicative of a possible mismatch between the direction of the video track and the read-out apparatus. In order to prevent or remove this mismatch, the signals of the photodiodes are applied to a control system. For a more extensive description of the picture display device and the operation thereof, reference is made to the articles "Laser beam reading of video records" by C. H. F. Velzel in *Applied Optics*, vol. 17, No. 13, pp. 2029–2036 (July 1, 1978) and "The optical scanning system of the Philips "VLP" record player" by G. Bouwhuis and P. Burgstede in Philips *Technical Review* 33, No. 7, pp. 186–189 (1973).

Figure 7:
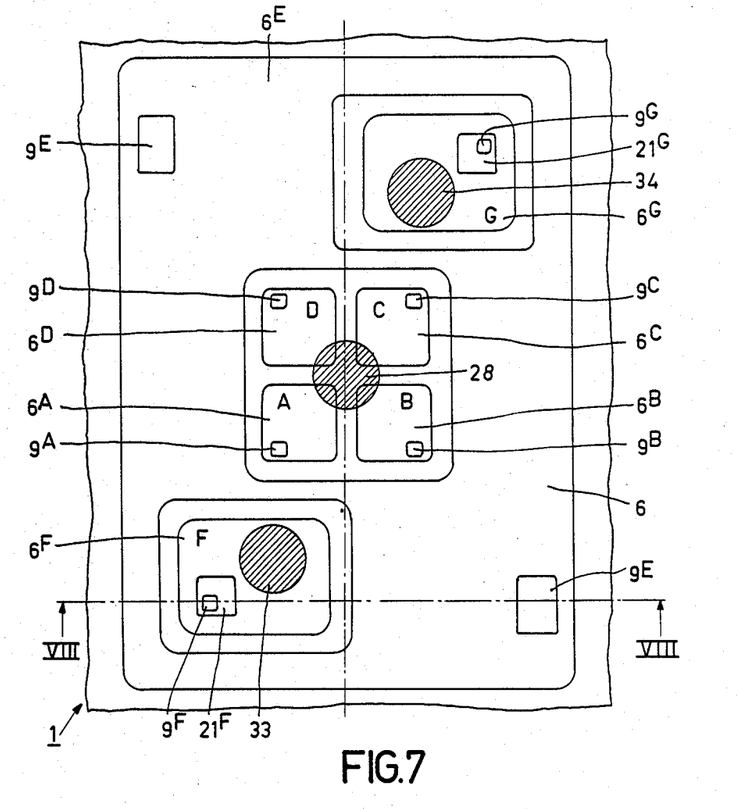
FIG. 7 is a plan view of a device in which the semiconductor device shown in FIGS. 1, 2 is used.
Figure 8:
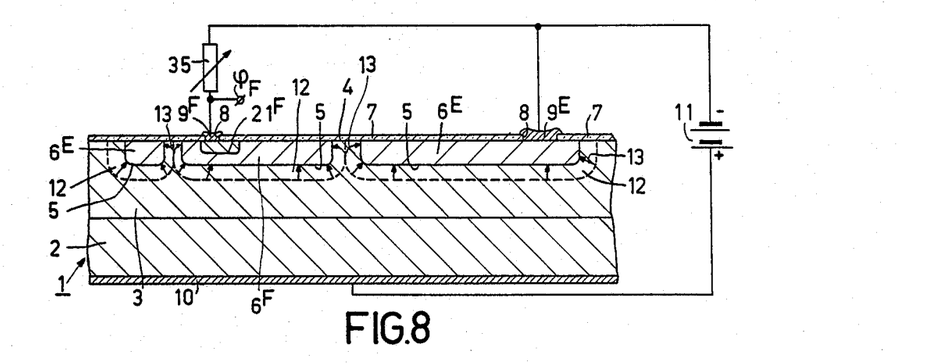
FIG. 8 is a cross-sectional view taken on the line VIII—VIII in FIG. 7.

When a semiconductor device is shown in FIGS. 7 and 8 forms part of a detector 30 in a display device shown in FIG. 9, the modulated beam 28 is displayed on the quadrant diode formed by the surface regions $6^A$, $6^B$, $6^C$, $6^D$. The two extra beams are displayed on the photo-transistors F and G (the targets of the beam 28 and the two extra beams are shown in FIG. 7 by shaded circles 28, 33, 34). As a result of charge carriers generated by the extra beams the photo-transistors F, G become conductive; the base current through the p-n junctions 5 is amplified and the emitter currents cause signals $\phi_F$ and $\phi_G$ at the outputs which are applied to the control system for track following. During the manufacture of the semiconductor device shown in FIGS. 7 and 8, however, the dimensions and other properties of the transistors F and G mutually may differ slightly as a result of process tolerances. As a result of this the possibility exists that with exposure and adjustment being the same said transistors nevertheless provide different currents. In order to avoid such a current difference the device comprises a control resistor 35 with which the device can be calibrated.

Figure 10:
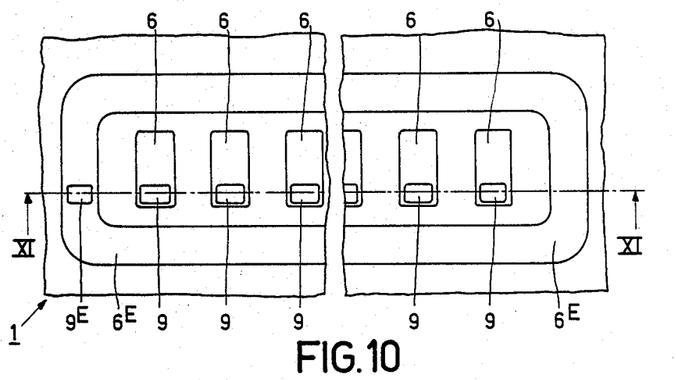
FIG. 10 is a plan view of another radiation-sensitive semiconductor device in accordance with the invention.
Figure 11:
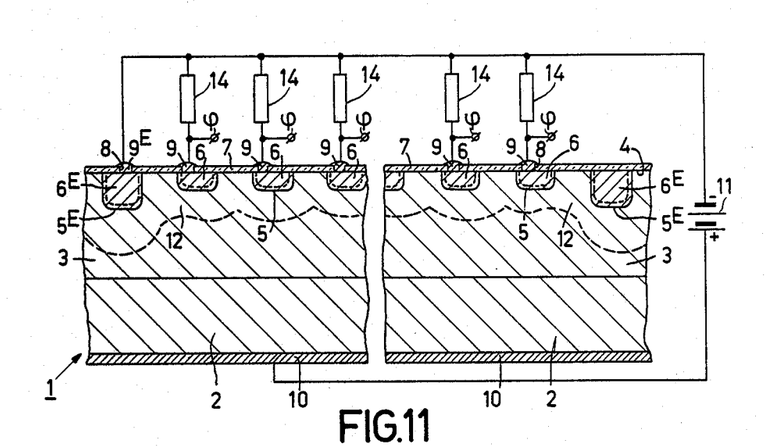
FIG. 11 is a cross-sectional view taken on the line XI—XI in FIG. 10.

FIG. 10 is a plan view and FIG. 11 is a cross-sectional view taken on the line XI—XI in FIG. 10 of a radiation-sensitive semiconductor device according to the invention useful, for example, in spectroscopic applications (for example, short-wave light, X-rays). When one of the p-n junctions 5, as a result of exposure in the immediate ambience of the associated region 6, provides a photoelectric current, a voltage drop is formed across the associated resistor 14, which gives rise to an output signal $\phi$. The location of the p-n junction 5 determines which output gives a signal. Since the depletion layers of the various p-n junctions 5 again touch each other, the device is fast and sensitive to incident radiation over substantially its whole surface. In order to counteract the influence of undesired radiation and leakage currents from the edge, the surface regions 6 are surrounded by an annular surface region $6^E$ at such a distance that during use the depletion region 12 associated with the p-n junction 5 between the region $6^E$ and the epitaxial layer 3 at least touches the depletion regions 12 associated with the other p-n junctions 5. Otherwise the reference numerals again have the same meanings as in the preceding examples.

Figure 12:
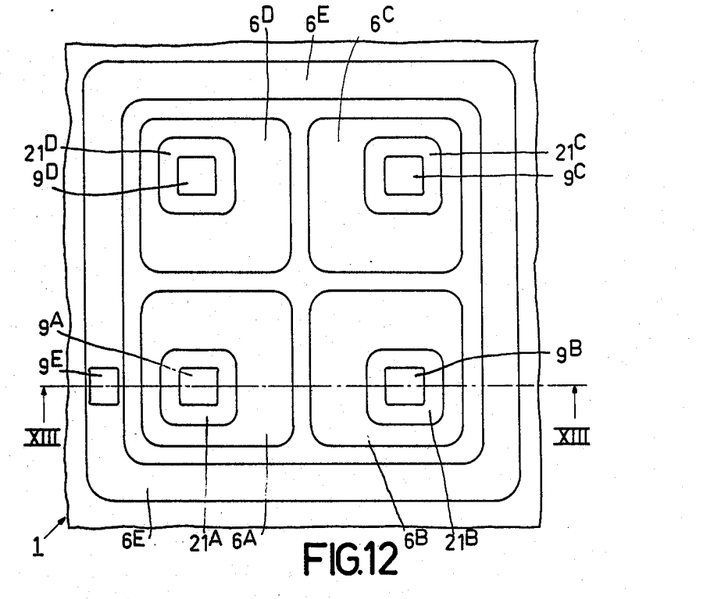
FIG. 12 is a plan view of another radiation-sensitive semiconductor device in accordance with the invention.
Figure 13:
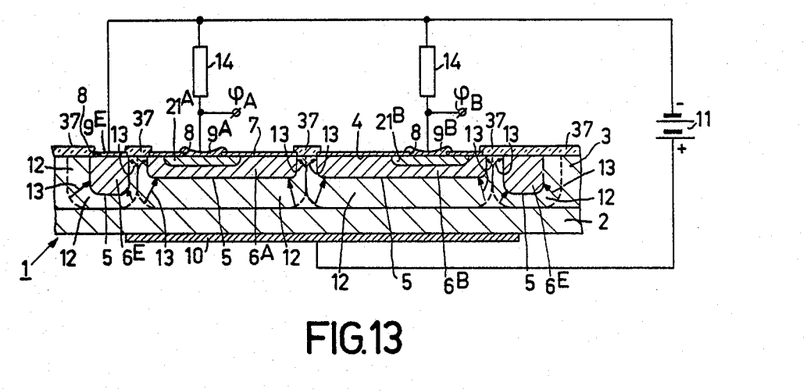
FIG. 13 is a cross-sectional view of the semiconductor device taken on the line XIII—XIII in FIG. 12.

FIGS. 12 and 13 show a variation of the device shown in FIGS. 1 and 2. The surface regions $6^A$, $6^B$, $6^C$, $6^D$ now form the bases of sub-elements of a quadrant transistor.

At the surface 4 the regions $6^A$, $6^B$, $6^C$, $6^D$ are provided with emitter regions $21^A$, $21^B$, $21^C$, $21^D$ which can be connected to a voltage source 11 (FIG. 13) via contacts $9^A$, $9^B$, $9^C$, $9^D$.

In order to detect the current generated by the radiation-sensitive junctions 5 the device again comprises resistors 14 across which a signal $\phi$ is measured. In this example the device shown in FIGS. 12, 13 has been made specially suitable for detection of particle radiation by providing them between the regions 6 with a particle absorbing layer 37. This layer has a function similar to that of the radiation-reflecting layer 36 in the device shown in FIGS. 1 and 2, namely to reduce the quantity of generated charge carriers in the region between the surface regions 6, so that the peak currents $I_1$ (curves 19 and 20 in FIG. 4) are avoided. Otherwise the operation of the device is similar to that of FIGS. 1 and 2, with the understanding that the current generated in the p-n junctions 5 is amplified by the transistor action. The remaining reference numerals again have the same meanings as in the preceding examples.

Of course the invention is not restricted to the above embodiments but many variations are possible to those skilled in the art without departing from the scope of this invention. For example, the conductivity types of the semiconductor device may (simultaneously) be reversed (together with the polarity of the voltage source 11). Semiconductor materials other than silicon may also be used, for example germanium, or compounds of the III-V-type, for example gallium arsenide. Instead of the p-n junction 5 the depletion regions 12 can also be generated by means of Schottky contacts on the semiconductor material which will then have to be radiation permeable. For this purpose, for example, they are manufactured from antimony-doped tin oxide or indium oxide which may or may not be doped with tin (p-type or n-type).

Instead of providing the surface regions 6 in the epitaxial layer 3, they can also be provided directly in the substrate, the substrate material having a resistance of, for example, 10 Ohm.cm.

In the device shown in FIGS. 7, 8 the narrow strip of the common sub-element $6^E$ between the parts $6^A$, $6^B$, $6^C$, $6^D$ and the bases of the photo-transistor $6^F$, $6^G$ may be omitted, if desired, provided the associated depletion regions 12 of the regions $6^F$ and $6^A$, $6^B$ and $6^G$ and $6^C$, $6^D$, respectively, again touch each other in accordance with the invention.

In the diode shown in FIGS. 5 and 6 the surface region $6^E$ may be screened from incident radiation, if desired, by means of a metal layer, while the device is provided with means to measure the leakage current through the associated p-n junction 5. In this manner the thermally generated leakage current through the p-n junction can be measured, the value of which may be used to correct the signal measured via the sub-element $6^A$ for said thermal component.

Furthermore, instead of resistors 14, transistors may be used for signal processing; these transistors (bipolar or, if desired, field effect transistors) may be integrated in the semiconductor body as well as, for example, circuits for the control systems described.

The passivating layer 7 may in addition be chosen to be so thick for certain wavelengths that no reflection at all occurs. If desired, for this purpose oxide nitride layers may be used. Simultaneously the thickening 36 present between the regions 6 may be chosen to be so that the curves 17, 18 in FIG. 4 show optimum variations.

What is claimed is:

1. A radiation sensitive semiconductor device comprising a semiconductor body having a substrate, an epitaxial semiconductor layer on said substrate and having a substantially flat surface exposed to radiation during operation, the resistivity of said semiconductor layer being between about 50–200 ohm.cm and the resistivity of said substrate being substantially less than 50 ohm.cm, at least one radiation-sensitive element at said surface, said radiation-sensitive element comprising at least two radiation-sensitive sub-elements forming rectifying junctions with said semiconductor layer, means for separately applying a reverse bias to said rectifying junctions of each of said sub-elements, the distance between adjacent sub-elements and the thickness of said semiconductor layer being so small that in operation the depletion regions associated with said rectifying junctions extend in a lateral direction parallel to said surface so as to merge, and extend in a vertical direction perpendicular to said surface so as to deplete said semiconductor layer over the greater part of its thickness, the lateral distance between adjacent sub-elements being at most equal to twice the thickness in the lateral direction of the depletion region located laterally adjacent and associated with each sub-element during operation, each of said radiation-sensitive sub-elements comprising means for detecting a current through said sub-element generated by radiation impinging on said surface, and the surface area between adjacent radiation-sensitive sub-elements and the major part of each of said sub-elements being accessible to said radiation.

2. A radiation-sensitive semiconductor device as claimed in claim 1, characterized in that the distance between said sub-elements is at most 10 micrometers.

3. A radiation-sensitive semiconductor device as claimed in claim 1, characterized in that the distance between said sub-elements is approximately 5 micrometers.

4. A radiation-sensitive semiconductor device as claimed in claim 1, 2 or 3, characterized in that the radiation-sensitive device comprises a plurality of sub-elements situated symmetrically about a point on the surface.

5. A radiation-sensitve semiconductor device as claimed in claims 1, 2 or 3, characterized in that the radiation-sensitive device comprises at least a row of juxtaposed sub-elements.

6. A radiation-sensitive semiconductor device as claimed in claims 1, 2 or 3, characterized in that the radiation-sensitive device comprises a further sub-element which surrounds said radiation-sensitive sub-elements substantially entirely.

7. A radiation-sensitive semiconductor device as claimed in claim 6, characterized in that at least two radiation-sensitive elements have a common further sub-element.

8. A radiation-sensitive semiconductor device as claimed in claim 1, characterized in that the device comprises means by which less radiation penetrates in those places of the surface where depletion regions can reach the surface than in other places.

9. A radiation-sensitive semiconductor device as claimed in claim 8, characterized in that the surface of the semiconductor body is covered with a layer of anti-reflective material which is more reflective at the area of the depletion regions than at the area of the sub-elements.

10. A radiation-sensitive semiconductor device for detection of particle radiation as claimed in claim 8, characterized in that said means by which less radiation penetrates comprises a layer of particle-absorbing passivating material.

11. A radiation-sensitive semiconductor device as claimed in claim 8, 9 or 10, characterized in that said means by which less radiation penetrates comprises a doping mask via which mask semiconductor regions associated with the sub-elements are provided in the semiconductor body.

12. A radiation-sensitive semiconductor device as claimed in claim 1, characterized in that the device comprises at least one circuit element for applying said reverse bias and at least one current detector for detecting current generated by incident radiation.

* * * * *